(12) United States Patent
Zhang et al.

(10) Patent No.: US 9,793,413 B2
(45) Date of Patent: Oct. 17, 2017

(54) METAL OXIDE THIN FILM TRANSISTOR HAVING CHANNEL PROTECTION LAYER

(71) Applicant: BOE Technology Group Co., Ltd., Beijing (CN)

(72) Inventors: Li Zhang, Beijing (CN); Meili Wang, Beijing (CN); Fengjuan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 38 days.

(21) Appl. No.: 14/771,526

(22) PCT Filed: Oct. 30, 2014

(86) PCT No.: PCT/CN2014/089891
§ 371 (c)(1),
(2) Date: Aug. 31, 2015

(87) PCT Pub. No.: WO2016/029541
PCT Pub. Date: Mar. 3, 2016

(65) Prior Publication Data
US 2017/0005198 A1    Jan. 5, 2017

(30) Foreign Application Priority Data

Aug. 29, 2014    (CN) .......................... 2014 1 0437600

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1225* (2013.01); *H01L 29/66969* (2013.01); *H01L 29/786* (2013.01); *H01L 27/3262* (2013.01)

(58) Field of Classification Search
CPC . H01L 27/1248; H01L 27/127; H01L 27/124; H01L 27/1288; H01L 27/1255
(Continued)

(56) References Cited

U.S. PATENT DOCUMENTS 8,232,552 B2    7/2012 Yano et al.
8,507,111 B2    8/2013 Inoue et al.
(Continued)

FOREIGN PATENT DOCUMENTS

CN    1918672 A    2/2007
CN    101350364 A    1/2009
(Continued)

OTHER PUBLICATIONS

Office Action for Chinese Patent Application No. 201410437600.4 dated Jun. 20, 2016.
(Continued)

*Primary Examiner* — Evan Pert
*Assistant Examiner* — Changhyun Yi
(74) *Attorney, Agent, or Firm* — Westman, Champlin & Koehler, P.A.

(57) ABSTRACT

The present disclosure provides a method for producing a thin film transistor. The method includes the steps of: forming a protective layer on an active layer of the thin film transistor and patterning the protective layer along with the active layer when the active layer is deposited; depositing a source and drain electrode layer and patterning it by a dry etching to form a source electrode and a drain electrode; and etching or passivating the protective layer located in a back channel region of the source electrode and the drain electrode. In addition, the present disclosure also discloses a thin film transistor produced by the above method, and an array substrate.

17 Claims, 9 Drawing Sheets

(51) Int. Cl.
*H01L 29/66* (2006.01)
*H01L 27/32* (2006.01)

(58) Field of Classification Search
USPC .................................. 438/29, 104, 151, 160
See application file for complete search history.

(56) References Cited

U.S. PATENT DOCUMENTS

| | | | |
|---|---|---|---|
| 2010/0224878 A1 | 9/2010 | Kimura | |
| 2011/0104841 A1* | 5/2011 | Shieh | H01L 27/1214 438/34 |
| 2011/0263079 A1* | 10/2011 | Wang | H01L 21/28506 438/149 |
| 2013/0095606 A1* | 4/2013 | Bayraktaroglu | H01L 29/7869 438/104 |
| 2014/0011329 A1* | 1/2014 | Zhang | H01L 29/66969 438/158 |
| 2015/0008429 A1* | 1/2015 | Ito | H01L 23/53238 257/43 |
| 2015/0021597 A1* | 1/2015 | Lu | H01L 29/66742 257/43 |

FOREIGN PATENT DOCUMENTS

| | | |
|---|---|---|
| CN | 101826521 A | 9/2010 |
| CN | 102122673 A | 7/2011 |
| CN | 102646699 A | 8/2012 |
| CN | 102709327 A | 10/2012 |
| CN | 103098220 A | 5/2013 |
| CN | 103730346 A | 4/2014 |
| CN | 103972299 A | 8/2014 |
| CN | 103985764 A | 8/2014 |
| TW | 200845399 A | 11/2008 |

OTHER PUBLICATIONS

First Office Action, including Search Report, for Chinese Patent Application No. 201410437600.4, dated Jun. 3, 2015, 9 pages.
Second Office Action for Chinese Patent Application No. 201410437600.4, dated Jan. 29, 2016, 9 pages.
International Search Report and Written Opinion for PCT Application No. PCT/CN2014/089891, dated May 27, 2015, 11 pages
English translation of Box No. V from the Written Opinion for the International Searching Authority for PCT Application No. PCT/CN2014/089891, 4 pages.
Rejection Decision for Chinese Patent Application No. 201410437600.4, dated Dec. 30, 2016, 9 pages.

* cited by examiner

METAL OXIDE THIN FILM TRANSISTOR HAVING CHANNEL PROTECTION LAYER

CROSS-REFERENCE TO RELATED APPLICATIONS

This application is a Section 371 National Stage Application of International Application No. PCT/CN2014/089891, filed 30 Oct. 2014, which claims the benefit of Chinese Patent Application No. 201410437600.4 filed on Aug. 29, 2014 in the State Intellectual Property Office of China, the whole disclosure of which is incorporated herein by reference.

BACKGROUND

Field of the Disclosure

The present disclosure relates to the technical field of display, and in particular, to a thin film transistor, a method of producing the same, an array substrate and a display apparatus.

Description of the Related Art

An oxide thin film transistor and an amorphous silicon thin film transistor both can be used in a display apparatus such as a liquid crystal display (LCD), an active matrix/organic light emitting diode (AMOLED) display, an organic light-emitting diode (OLED) display and a polymer light-emitting diode (PLED) display. In comparison with the amorphous silicon thin film transistor, the oxide thin film transistor has carrier concentration ten times of that of the amorphous silicon thin film transistor. In addition, the oxide thin film transistor may be produced by sputtering, thus use of the oxide thin film transistor will not need to significantly change the production line of the conventional display apparatus such as liquid crystal panel. Meanwhile, as it is not limited by the apparatus required for such as ion implantation process and laser crystallization process, the oxide thin film transistor is more helpful to manufacturing of large size display panel than the amorphous silicon thin film transistor.

In the prior art, the oxide semiconductor material is typically used as an active layer of the thin film transistor, but the currently primary oxide semiconductor material is not easy to achieve back channel etching structure. It hinders development and application of the oxide thin film transistor significantly. In addition, the density or the tightness of the metal electrode used in the conventional thin film transistor production process is not sufficient. In terms of the resisting effects to chemicals liquid during light exposing and developing, the current process for producing the thin film transistor is very difficult to meet the requirement for producing the oxide thin film transistor.

SUMMARY OF THE DISCLOSURE

In order to at least partly solve the problem existing in the prior art that the oxide semiconductor material is protected from erosion of the developer and etchant solution in subsequent patterning process, the present disclosure provides a thin film transistor, a method for producing the same, a display substrate and a display apparatus. The metal oxide such as zinc oxynitride is relatively sensitive to acid liquor and alkali liquor, but it also has characteristics that its resistance to plasma bombardment is strong. Thus, embodiments of the present invention use the metal oxide as the material of the active layer. In addition, in the present disclosure, the process for producing the thin film transistor will be redesigned from two aspects, i.e., the protective layer of the active layer and the metal electrode structure.

In accordance with an embodiment of the present invention, it provides a method for producing a thin film transistor, comprising the steps of:

forming a protective layer on an active layer of the thin film transistor and patterning the protective layer along with the active layer when the active layer is deposited;

depositing a source and drain electrode layer and patterning it by a dry etching to form a source electrode and a drain electrode;

etching or passivating the protective layer located in a back channel region of the source electrode and the drain electrode.

In an example, the protective layer is made from a metal material.

In an example, a passivation process is applied to the protective layer located above the back channel region to form a metal oxidation portion after the source and drain electrode layer is patterned.

In an example, the passivation process is an oxygen atmosphere annealing process or a plasma implantation process.

In an example, the passivation process to the protective layer is carried out by using patterns of the source electrode and the drain electrode as a self-alignment mask.

In an example, during patterning the source and drain electrode layer, over-etching the protective layer located above the back channel region to remove it and expose the back channel region.

In an example, the method further comprises the steps of:

depositing a gate layer on a substrate of the thin film transistor, performing light exposure, development and etching processes to it;

depositing a gate insulation layer on the gate layer, wherein the active layer is deposited on the gate insulation layer.

In an example, the method further comprises the steps of:

depositing a passivation layer and dry etching it to form a through hole after the source and drain electrode layer is patterned;

depositing a transparent electrode layer and etching it to form a transparent electrode.

In an example, the protective layer comprises any one of Zn, Sn, Mo, Al, W and Ti, or combination thereof.

In an example, the active layer is made from an oxide semiconductor material.

In an example, the active layer is made from zinc oxynitride or indium gallium zinc oxide.

In an example, the source electrode and the drain electrode each comprise at least two layers, and wherein the top one of the at least two layers has the densest structure.

In an example, the step of patterning the active layer and the protective layer comprises light exposing, developing and wet etching, and wherein the step of patterning the source and drain electrode layer comprises a dry etching.

In an example, the thin film transistor is used for a TFT-LCD display or an AMOLED display.

In accordance with another aspect of the present invention, it provides a thin film transistor produced by the method as described in any one of the above embodiments, the thin film transistor comprising: a gate layer, a gate insulation layer, an active layer, a protective layer, source and drain electrodes, a passivation layer and a transparent electrode arranged sequentially on a substrate of the thin film transistor, wherein the protective layer comprises a metal portion located in a region other than the back channel region between the source electrode and the drain electrode, the metal portion being arranged on two sides of a top surface of the active layer;

the source electrode and the drain electrode are arranged on two sides of the active layer and the metal portion respectively and cover a top surface of the metal portion; and wherein the portion of the protective layer in the back channel region is converted into a metal oxidation portion by a passivation process or is etched off.

In accordance with a further another aspect of the present invention, it provides an array substrate comprising the thin film transistor as described in the above embodiments or the thin film transistor produced by the method as described in the above embodiments.

In accordance with a yet further aspect of the present invention, it provides a display apparatus comprising the array substrate as described in the above embodiments.

The above technical solutions of the present disclosure have at least one part of the following advantageous effects:

(1) the present disclosure protects the active layer by using a metal protective layer after the metal oxide active layer is formed, it has an object of using the metal protective layer to resist erosion of the developer during patterning the metal oxide active layer, so as to protect the back channel of the metal oxide active layer while improving the ohm contact between the active layer and the source electrode and the drain electrode;

(2) during etching the source electrode and the drain electrode, the metal protective layer above the back channel region is over etched along with them, or the metal protective layer is passivated into an oxidation layer or an oxidation portion as an etch barrier layer by using oxygen atmosphere annealing or plasma process;

(3) in the present disclosure, the source electrode and the drain electrode each have a composite structure, which at least includes at least two layers of different metal materials, wherein the top structure is the densest structure which may protect the active layer from erosion;

(4) the process for producing the thin film transistor may be simplified, the production procedures and costs may be reduced.

DETAILED DESCRIPTION OF THE PREFERRED EMBODIMENTS

In order that objects, technical solutions and advantages of the present disclosure will become more apparent and explicit, embodiments of the present disclosure will be described hereinafter in detail with reference to the accompanying drawings.

Figure 1:
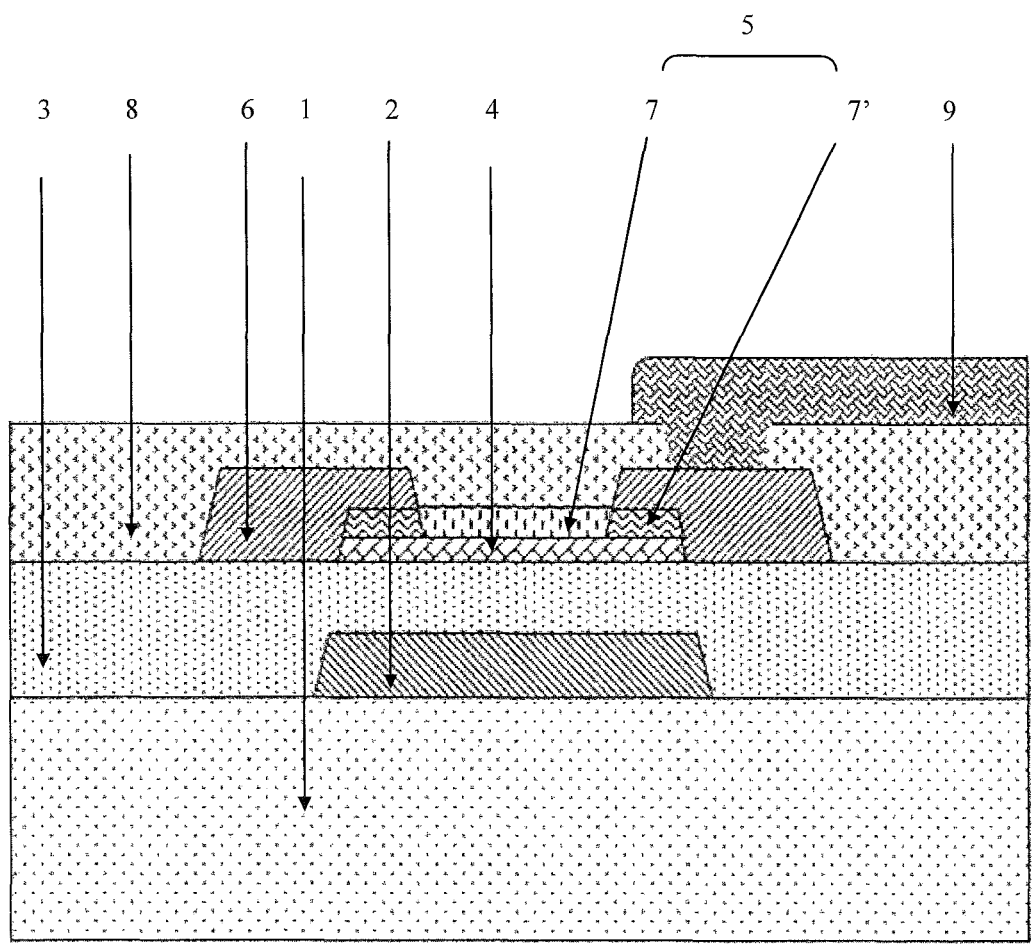
FIG. 1 is a schematic view showing a structure of a thin film transistor according to an embodiment of the present invention.

As illustrated in FIG. 1, an embodiment of the present invention provides a thin film transistor. The thin film transistor includes: a gate layer 2, a gate insulation layer 3, an active layer 4, a protective layer 5, a source electrode and a drain electrode 6, a passivation layer 8 and a transparent electrode 9 arranged sequentially on a substrate 1 of the thin film transistor.

In particular, the protective layer 5 includes a metal oxidation portion 7 located in a back channel region between the source electrode and the drain electrode 6 and a metal portion 7' located in a region other than the back channel region. Two metal portions 7' are arranged on two sides of a top surface of the active layer 4. In this way, the metal oxidation portion 7 is obtained by performing a passivation process on the protective layer 5 formed by metal, after patterning of the source electrode and the drain electrode 6. That is, the protective layer 5 is a metal protective layer before patterning of the source electrode and the drain electrode 6. In this way, the active layer 4 may be protected from erosion effects of the developer and the etchant solution in subsequent patterning process of, for example, the active layer and the source electrode and the drain electrode.

In an example, the active layer 4 is made from a metal oxide, such as zinc oxynitride (ZnON) or indium gallium zinc oxide (IGZO).

In an example, the protective layer 5 is made from a conductive material which can resist the developer and etchant solution. Preferably, the conductive material is one kind of metal material, for example conventional metals such as zinc, tin, molybdenum, aluminum, tungsten, or titanium. More preferably, the protective layer 5 is a thin metal layer. The metal material such as aluminum is not sensitive to the developer and the etchant solution for the source electrode and the drain electrode. When the aluminum material is used to produce the protective layer 5, it may prevent the developer and the etchant solution for the source electrode and the drain electrode from affecting the active layer 4, and when the passivation process is performed subsequently to form the metal oxidation portion 7, the aluminum can be converted into the corresponding metal oxide so as to prevent short circuit between the source electrode and the drain electrode to meet the basic requirements of the transistor.

Certainly, any suitable material for the protective layer 5 is feasible, instead of being limited to the above specific examples. That is, all of other conductive materials that have resist effects to the developer and etchant solution for the source electrode and the drain electrode and can be converted into insulation materials in the subsequent passivation process are feasible.

The protective layer 5 has a thickness of 50~150 Å, preferably 100 Å.

The source electrode and the drain electrode 6 are arranged on two sides of the active layer 4 and the metal portion 7' respectively and cover a top surface of the corresponding metal portion 7'.

Preferably, the source electrode and the drain electrode 6 is made from a conductive material, more preferably, the conductive material is a metal material.

Preferably, the source electrode and the drain electrode 6 each has a structure comprising at least two layers of different metal materials. The top one of the at least two layers has the densest structure. In order to form the densest structure, when the source electrode and the drain electrode 6 is formed, a composite structure of different materials may be used or parameters such as leading portion temperature, tailing portion temperature, power, gas pressure, magnet field intensity may be controlled, so as to ensure the top layer of each of the source electrode and the drain electrode 6 can have the densest structure. In this way, the top layer structure can protect the active layer 4 from erosion.

The metal oxidation portion 7' may prevent the source electrode and the drain electrode 6 from being electrically connected directly to each other.

Although the above examples show a bottom gate type back channel etching thin film transistor, the skilled person in the art can envisage the top gate type thin film transistor from the above disclosure, that is, the gate insulation layer 3 is located above the source electrode and the drain electrode 6 in the thin film transistor and the gate layer 2 is located on/above the gate insulation layer 3.

Figure 2:
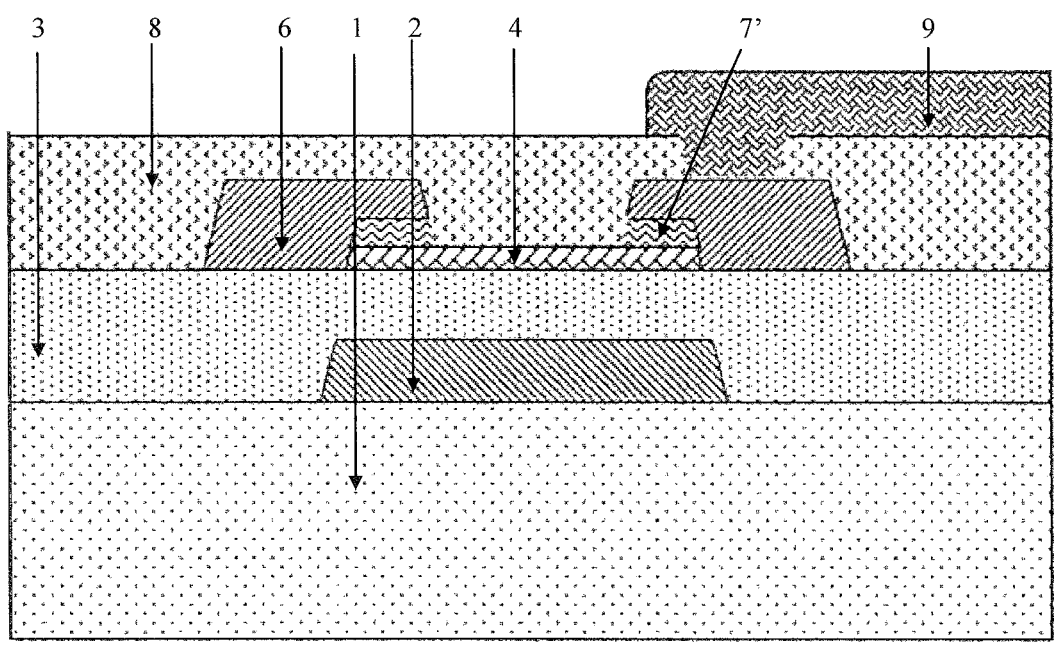
FIG. 2 is a schematic view showing a structure of a thin film transistor according to another embodiment of the present invention.

As illustrated in FIG. 2, it shows another type thin film transistor. In consideration that most of its structure is same to the example shown in FIG. 1. Thus, the same description will be omitted, but only difference of them will be explained in details.

In FIG. 2, in particular, a part of the protective layer 5 located in the back channel region of the source electrode and the drain electrode 6 is etched off so as to prevent direct electrical connection between the source electrode and the drain electrode 6.

The protective layer 5 in the back channel region may be removed by processes such as etching.

As discussed above, the thin film transistor shown in FIG. 2 may also take the bottom gate type thin film transistor, as an example. In view of this, the top gate type thin film transistor may be obtained easily.

In another embodiment of the present invention, it also provides an array substrate including the thin film transistor described as above.

In a further embodiment of the present invention, it also provides a display apparatus comprising the array substrate described as above.

The method for producing the thin film transistor according to an embodiment of the present invention shown in FIGS. 1 and 2 will be explained in detail below.

Figure 3:
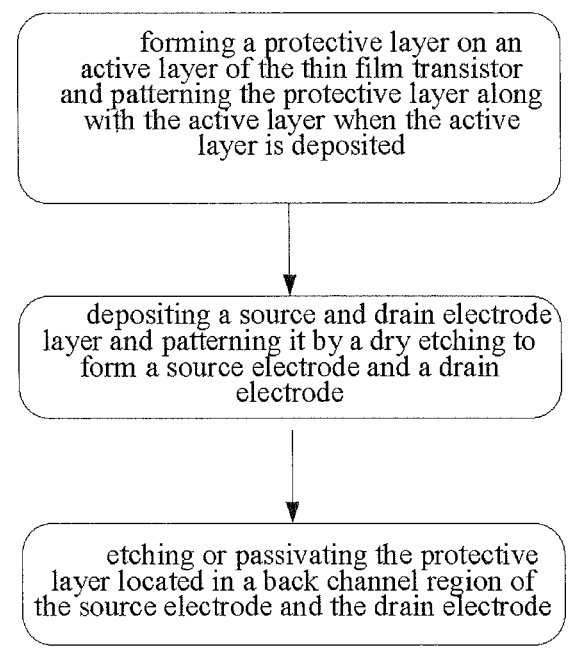
FIG. 3 is a flow chart of general concept of a method for producing the thin film transistor according to the present invention.

With reference to FIG. 3 along with FIGS. 1 and 2, the method includes the steps of:

when the active layer 4 of the thin film transistor is deposited, forming a protective layer 5 on an active layer 4 and patterning the protective layer 5 along with the active layer 4;

depositing a source and drain electrode layer and patterning it by dry etching to form a source electrode and a drain electrode 6;

etching or passivating the protective layer 5 located in a back channel region of the source electrode and the drain electrode 6.

In addition, the method further includes the steps of: depositing a gate layer 2 on a substrate 1 of the thin film transistor, performing light exposure, development and etching processes;

depositing an gate insulation layer 3 on the gate layer 2, wherein the active layer 4 is deposited on the gate insulation layer 3.

A passivation layer 8 is deposited and dry etched to form a through hole (not shown, that is, the part filled with the transparent electrode 9 located in the passivation layer 8) after forming patterns of the source electrode and the drain electrode 6;

a transparent electrode layer is deposited and etched to form a transparent electrode 9.

The substrate 1 is made from the material including such as glass, silicon, quartz, plastics, preferably glass. The active layer 4 is made from metal oxide, such as zinc oxynitride (ZnON) or indium gallium zinc oxide (IGZO).

A protective layer 5 is added on the active layer 4 and is patterned along with the active layer 4. Its object is to protect the active layer 4 from erosion of the developer and the etchant solution during the subsequent patterning of the active layer 4 and the source electrode and the drain electrode 6.

In particular, the protective layer 5 is made from a conductive material which can resist the developer and etchant solution. Preferably, the conductive material is a metal material, for example conventional metals such as zinc, tin, molybdenum, aluminum, tungsten, or titanium. More preferably, the protective layer 5 is a thin metal layer. The metal material such as aluminum is not sensitive to the developer and the etchant solution for the source electrode and the drain electrode. When the aluminum material is used to produce the protective layer 5, it may prevent the developer and the etchant solution for the source electrode and the drain electrode from affecting the active layer 4, and when the passivation process is performed subsequently to form the metal oxidation portion 7, the aluminum can be converted into the corresponding metal oxide so as to prevent short circuit between the source electrode and the drain electrode to meet the basic requirements of the transistor.

Optionally, the protective layer 5 has a thickness of 50~150 Å, preferably 100 Å.

In an embodiment of the present invention, the patterning of the active layer 4 and the protective layer 5 is finished by processing the active layer 4 and the protective layer 5 together, for example by using light exposing and developing and wet etching.

The source electrode and the drain electrode 6 are formed on the protective layer 5 and patterned.

Preferably, the source electrode and the drain electrode 6 are made from a conductive material including metal or doped polycrystalline silicon or other materials having conductive function for example metal nitride such as TiN, or TaN, preferably metal material, including such as Mo, Pt, Al, Ti, Co, Au, or Cu.

Optionally, the source electrode and the drain electrode 6 are formed by processes such as sputtering deposition and the patterning of the source electrode and the drain electrode 6 may be finished by processes such as dry etching.

Preferably, the source electrode and the drain electrode 6 each has a structure at least comprising at least two layers of different metal materials. The top one of the not less than two layers has the densest structure. In order to form the densest structure, when the source electrode and the drain electrode 6 are formed, a composite structure of different materials may be used or parameters such as leading portion temperature, tailing portion temperature, power, gas pressure, magnet field intensity may be controlled, so as to ensure the top layer of each of the source electrode and the drain electrode 6 can have the densest structure.

In the present disclosure, by means of passivating the part of the protective layer 5 in the back channel region into the metal oxidation portion or etching off it and then depositing the passivation layer 8 thereon after the patterning of the source electrode and the drain electrode 6, the directly electrical connection between the source electrode and the drain electrode 6 is prevented.

In an embodiment shown in FIG. 1, a passivation process is performed on the protective layer 5 (made from a metal) exposed in the back channel region of the source electrode and the drain electrode 6 to form the metal oxidation portion 7, that is, the passivation process is performed on the protective layer 5 by using the pattern formed by the source electrode and the drain electrode 6 as self alignment mask to form the metal oxidation portion 7.

In an example, the passivation process includes such as oxygen atmosphere annealing or plasma process.

In the embodiment shown in FIG. 2, the protective layer 5 located in the back channel region of the source electrode and the drain electrode 6 is removed and is filled with a part of the passivation layer 8 deposited subsequently to function to prevent the source electrode and the drain electrode 6 from being electrically connected directly to each other.

In the example, the protective layer 5 located in the back channel region of the source electrode and the drain electrode 6 may be removed for example by etching.

In addition, when producing the top gate type thin film transistor, the method further includes forming a gate insulation layer 3 on the source electrode and the drain electrode 6 and forming the gate layer 2 on the gate insulation layer 3.

Figure 4A:
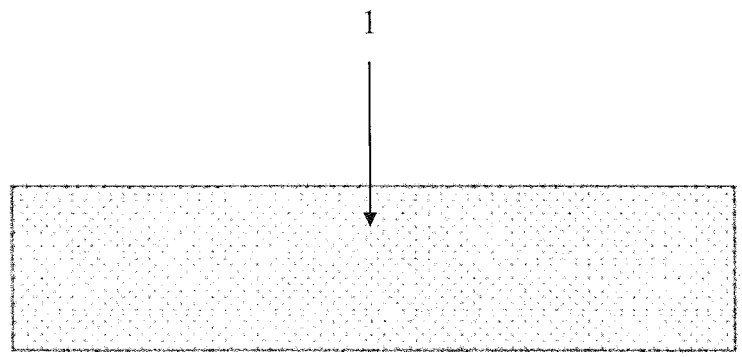
FIG. 4 (including FIGS. 4a-4g) is a flow chart of a process for producing the thin film transistor shown in FIG. 1.
Figure 4B:
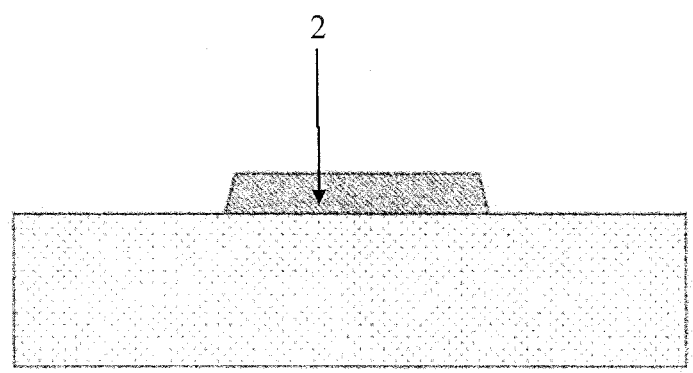
Figure 4C:
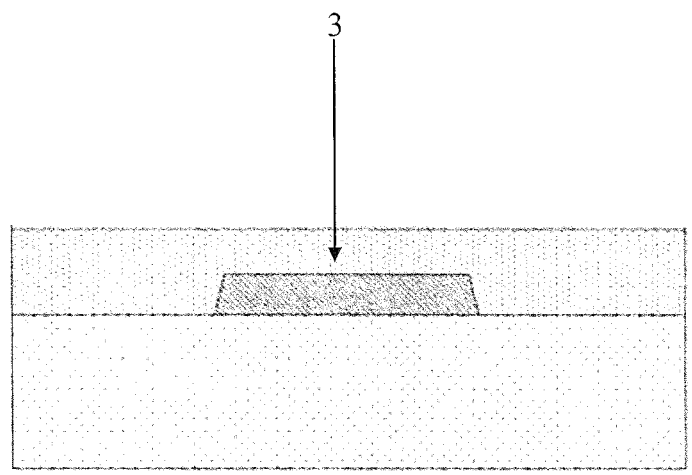
Figure 4D:
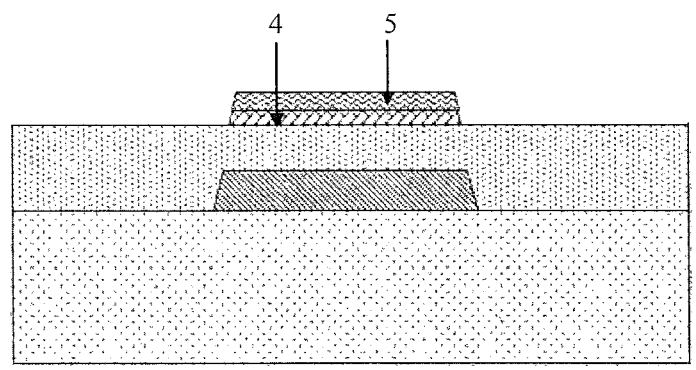
Figure 4E:
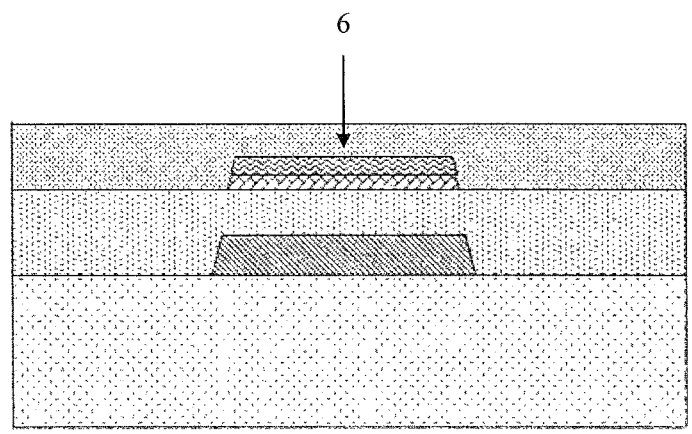
Figure 4F:
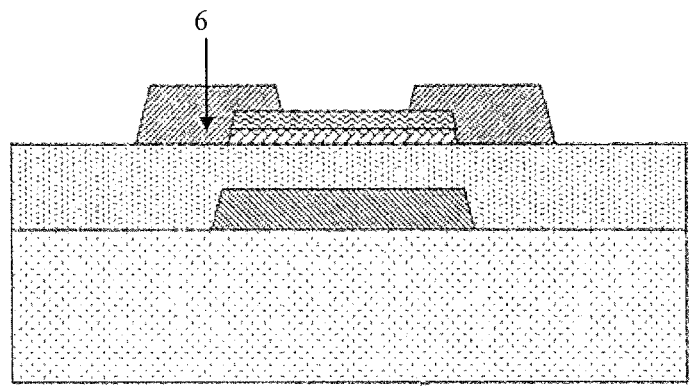
Figure 4G:
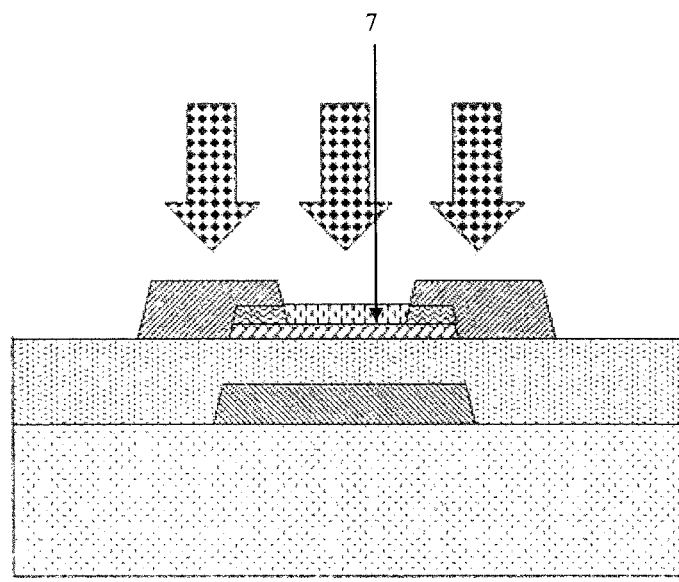

The technical solutions of embodiments of the present invention will below be explained in details with reference to the bottom gate type thin film transistor. In the example shown in FIG. 4, a passivation process is performed on the protective layer 5 exposed in the back channel region of the source electrode and the drain electrode 6 to form the metal oxidation portion 7. As illustrated in FIG. 4, the method for producing the thin film transistor includes the following steps of:

providing a substrate 1, for example, a glass substrate, as illustrated in FIG. 4a;

foaming a gate layer on the substrate 1 and performing light exposing, developing and etching to form a gate 2 with a desired pattern, as illustrated in FIG. 4b, wherein, the gate layer is made from a conductive material, for example a metal, a semiconductor material, preferably a metal material;

depositing a gate insulation layer 3 on the substrate 1 formed with the gate 2, as illustrated in FIG. 4c, optionally, the gate insulation layer 3 may be deposited by low temperature CVD process, made preferably from insulation materials, including such as silicon oxide, silicon nitride, silicon oxynitride or combination of these materials;

forming an active layer 4 and a metal protective layer 5 in sequence on the gate insulation layer 3 and performing the light exposing, developing and wet etching on them together, as illustrated in FIG. 4d;

forming a source electrode and a drain electrode layer on the above structure, as illustrated in FIG. 4e, and finalizing the patterning process by drying etching, as illustrated in FIG. 4f;

wherein the source electrode and the drain electrode 6 are made from a conductive material, preferably a metal;

performing a passivation process on the protective layer 5 located in the back channel region by using the pattern formed by the source electrode and the drain electrode 6 as a self-alignment mask to passivate the protective layer 5 exposed in the back channel region of the source electrode and the drain electrode 6, so as to form a metal oxidation portion 7, as illustrated in FIG. 4g;

then, depositing a non-metal passivation layer 8 and forming a through hole (not shown) by a dry etching; and depositing a transparent electrode layer thereon and etching it to form a transparent electrode 9.

Figure 5A:
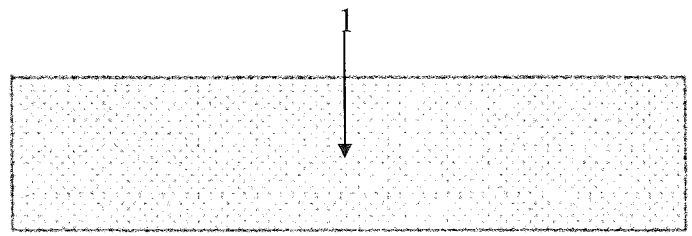
FIG. 5 (including FIGS. 5a-5f) is a flow chart of a process for producing the thin film transistor shown in FIG. 2.
Figure 5B:
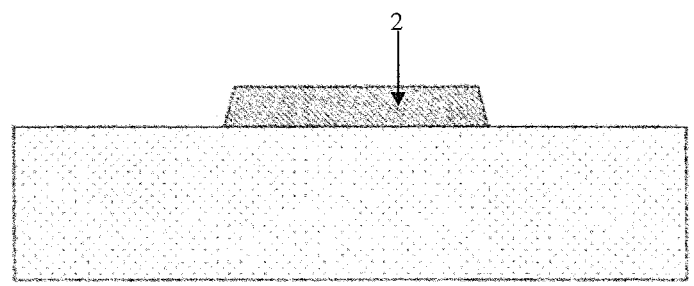
Figure 5C:
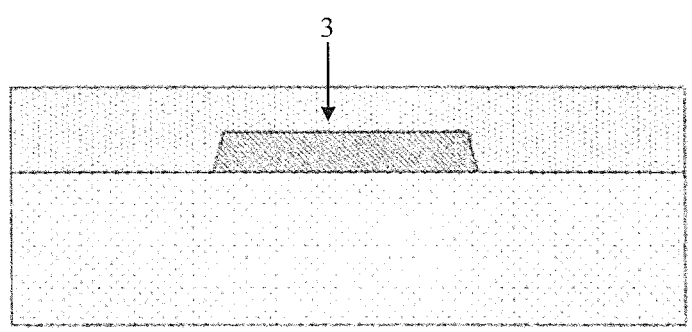
Figure 5D:
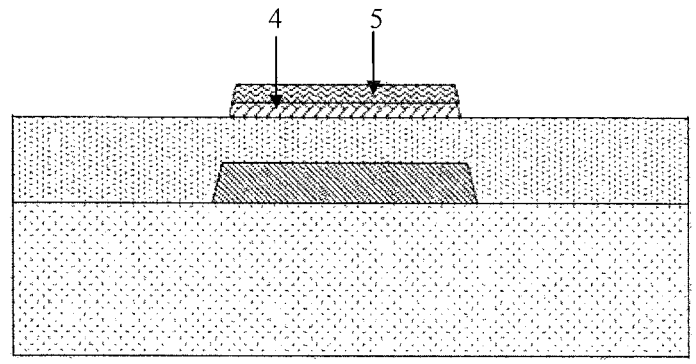
Figure 5E:
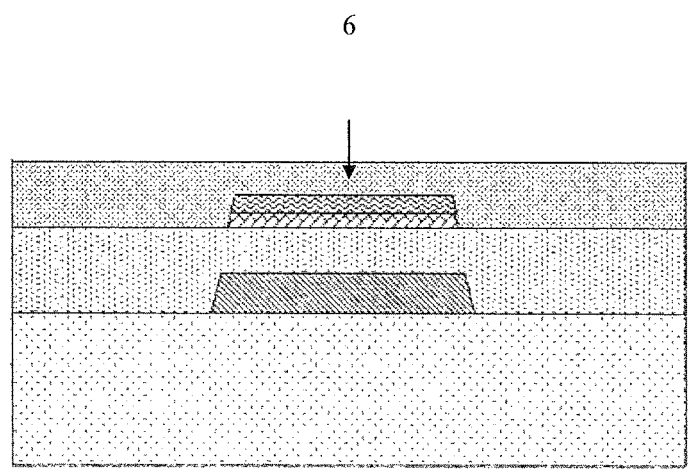
Figure 5F:
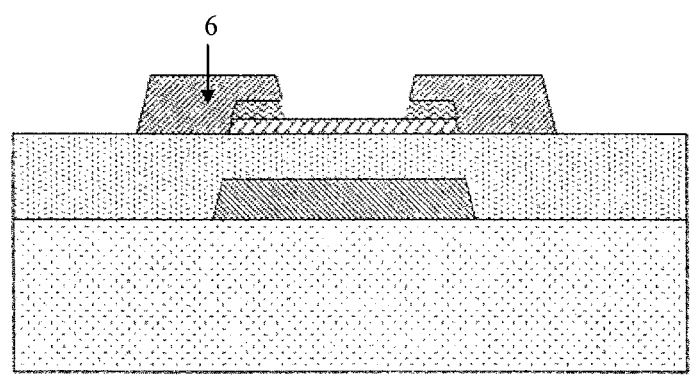

In the embodiment shown in FIG. 5, the protective layer 5 located in the back channel region of the source electrode and the drain electrode 6 is removed to prevent directly electrical connection between the source electrode and the drain electrode 6. As illustrated in FIG. 5, the method for producing the thin film transistor includes the steps of:

providing a substrate 1, for example, a glass substrate, as illustrated in FIG. 5a;

forming a gate layer on the substrate 1 and performing light exposing, developing and etching to form a gate 2 with a desired pattern, as illustrated in FIG. 5b;

depositing a gate insulation layer 3 on the substrate 1 formed with the gate 2, as illustrated in FIG. 5c, optionally, the gate insulation layer 3 is made from insulation materials;

forming an active layer 4 and a metal protective layer 5 in sequence on the gate insulation layer 3 and performing the light exposing, developing and wet etching on them together, as illustrated in FIG. 5d;

forming a source electrode and a drain electrode 6 on the above structure, as illustrated in FIG. 5e, and finalizing the patterning process by drying etching, wherein the source electrode and the drain electrode 6 are made from conductive materials, preferably a metal;

removing the protective layer 5 located in the back channel region of the source electrode and the drain electrode 6 to expose the back channel region, as illustrated in FIG. 5f;

preferably, removing the protective layer 5 located in the back channel region by process such as etching;

then, depositing a non-metal passivation layer 8 and forming a through hole (not shown) by dry etching; and depositing a transparent electrode layer thereon and etching it to form a transparent electrode 9.

The specific flows of producing the top gate type thin film transistor are similar to those of producing the bottom gate type thin film transistor except for the order of forming the gate layer 2 and the gate insulation layer 3. In the top gate type thin film transistor, the gate insulation layer 3 is formed on/above the source electrode and the drain electrode 6 and the gate 2 is formed on/above the gate insulation layer 3. All of other processes are same to those for producing the bottom gate type thin film transistor.

The skilled person in the art should understand, in the process for producing the thin film transistor, after forming the active layer from the oxide material, a protective layer (for example metal protective layer) is needed to be formed on the active layer so as to prevent the active layer from being eroded in etching the metal layer to form the source electrode and the drain electrode, as the oxide is relatively sensitive to the developer and etchant solution for the source electrode and the drain electrode. Generally, special patterning of the metal protective layer is needed. However, in the process for producing the thin film transistor provided by the above embodiment, the conductive materials that can resist the developer and etchant solution for the source electrode and the drain electrode are selected as a metal protect layer material and pattern the active layer and the metal protective layer together and the passivation process is carried out after forming the source and drain electrode layer such that the metal protective layer in the back channel region of the source and drain electrode layer form an insulation material that is not conductive electrically, or the metal protective layer in the back channel region of the source and drain electrode layer is removed directly so as to prevent short-circuit effect between the source electrode and the drain electrode. The entire producing process becomes simpler and cheaper than that in the prior art.

Further, in the above description for the producing method, as the specific processes such as etching used in each step and the corresponding patterns to be formed are substantially same to the prior art, the specific explanations will be omitted herein. However, the skilled person in the art should understand that all of any other technical solutions that use any other conductive materials functioning to resist the developer and etchant solution for the source electrode and the drain electrode and can convert the material in the channel region of the source electrode and the drain electrode into the insulation material in subsequent processes, shall fall within the protect scope of the present invention.

The objects, technical solutions and advantageous effects of the present disclosure have been described in details with reference to the above specific embodiments. It should be understood that the above embodiments are given only by ways of examples instead of limiting the present disclosure. Any changes, equivalent replacement, modification within the spirit and principles of the disclosure can be made by those skilled in the art and should fall within the scope of the present disclosure.

What is claimed is:

1. A method for producing a metal oxide thin film transistor having a protective layer in a back channel region, comprising the steps of:
    forming a protective layer on an active layer of the metal oxide thin film transistor and patterning the protective layer along with the active layer when the active layer is deposited;
    depositing a source and drain electrode layer and patterning the source and drain electrode layer by a dry etching to form a source electrode and a drain electrode, wherein bottom surfaces of the source electrode and the drain electrode are located at a same height level as a bottom surface of the active layer, and the source electrode and the drain electrode respectively partially cover the patterned protective layer and the active layer at both sides of the patterned protective layer and the active layer;
    etching or passivating the protective layer located in the back channel region of the source electrode and the drain electrode,
    wherein the protective layer is made from a metal material.

2. The method according to claim 1, wherein a passivation process is applied to the protective layer located above the back channel region to form a metal oxidation portion after the source and drain electrode layer is patterned.

3. The method according to claim 2, wherein the passivation process is an oxygen atmosphere annealing process or a plasma implantation process.

4. The method according to claim 3, wherein the passivation process to the protective layer is carried out by using patterns of the source electrode and the drain electrode as a self-alignment mask.

5. The method according to claim 4, wherein the source electrode and the drain electrode each comprise at least two layers, and wherein the top one of the at least two layers has the densest structure.

6. The method according to claim 1, wherein during patterning the source and drain electrode layer, over-etching the protective layer located above the back channel region to remove the protective layer located above the back channel region and expose the back channel region.

7. The method according to claim 6, wherein the source electrode and the drain electrode each comprise at least two layers, and wherein the top one of the at least two layers has the densest structure.

8. The method according to claim 1, further comprising the steps of:
    depositing a gate layer on a substrate of the thin film transistor, performing light exposure, development and etching processes to the gate layer;
    depositing a gate insulation layer on the gate layer, wherein the active layer is deposited on the gate insulation layer.

9. The method according to claim 8, further comprising the steps of:
    depositing a passivation layer and dry etching the passivation layer to form a through hole after the source and drain electrode layer is patterned;
    depositing a transparent electrode layer and etching the transparent electrode layer to form a transparent electrode.

10. The method according to claim 1, wherein the protective layer comprises any one of Zn, Sn, Mo, Al, W and Ti, or combination thereof.

11. The method according to claim 1, wherein the active layer is made from an oxide semiconductor material.

12. The method according to claim 11, wherein the active layer is made from zinc oxynitride or indium gallium zinc oxide.

13. The method according to claim 1, wherein the source electrode and the drain electrode each comprise at least two layers, and wherein a top one of the at least two layers has densest structure.

14. The method according to claim 1, wherein the step of patterning the active layer and the protective layer comprises light exposing, developing and wet etching, and wherein the step of patterning the source and drain electrode layer comprises a dry etching.

15. The method according to claim 1, wherein the thin film transistor is used for a TFT-LCD display or an AMO-LED display.

16. A thin film transistor produced by the method according to claim 1, comprising: a gate layer, a gate insulation layer, an active layer, a protective layer, a source electrode and a drain electrode, a passivation layer and a transparent electrode arranged sequentially on a substrate of the thin film transistor,
    wherein the protective layer comprises a metal portion located in a region other than a back channel region between the source electrode and the drain electrode, the metal portion being arranged on two sides of a top surface of the active layer;
    the source electrode and the drain electrode are arranged on the two sides of the active layer and the metal portion respectively and cover a top surface of the metal portion; and
    wherein a portion of the protective layer in the back channel region is converted into a metal oxidation portion by a passivation process or is etched off.

17. An array substrate, comprising the thin film transistor according to claim 16.

* * * * *